(12) United States Patent
Shivanna et al.

(10) Patent No.: US 11,413,767 B2
(45) Date of Patent: Aug. 16, 2022

(54) SENSOR-BASED POSITION AND ORIENTATION FEEDBACK OF ROBOT END EFFECTOR WITH RESPECT TO DESTINATION CHAMBER

(71) Applicant: Applied Materials, Inc., Santa Clara, CA (US)

(72) Inventors: Preetham Kariyaiah Shivanna, Karnataka (IN); Jeffrey Hudgens, San Francisco, CA (US); Paul Zachary Wirth, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 363 days.

(21) Appl. No.: 16/666,963

(22) Filed: Oct. 29, 2019

(65) Prior Publication Data
US 2021/0125851 A1    Apr. 29, 2021

(51) Int. Cl.
| | |
|---|---|
| *B25J 13/08* | (2006.01) |
| *B25J 9/16* | (2006.01) |
| *B25J 11/00* | (2006.01) |
| *H01L 21/67* | (2006.01) |
| *H01L 21/68* | (2006.01) |
| *H01L 21/683* | (2006.01) |

(52) U.S. Cl.
CPC ............ *B25J 13/08* (2013.01); *B25J 9/1697* (2013.01); *H01L 21/67259* (2013.01); *H01L 21/681* (2013.01); *H01L 21/6838* (2013.01); *B25J 11/0095* (2013.01); *Y10S 414/135* (2013.01)

(58) Field of Classification Search
CPC ........................................................ B25J 13/08
See application file for complete search history.

(56) References Cited

U.S. PATENT DOCUMENTS

| | | | |
|---|---|---|---|
| 6,690,986 B1* | 2/2004 | Mitchell | H01L 21/681 414/217 |
| 6,763,281 B2 | 7/2004 | Schauer et al. | |
| 6,925,356 B2 | 8/2005 | Schauer et al. | |
| 8,224,607 B2 | 7/2012 | Sakhare et al. | |
| 8,698,889 B2 | 4/2014 | Ravid et al. | |
| 9,111,979 B2 | 8/2015 | Fairbairn | |
| 2007/0180676 A1* | 8/2007 | Hwang | H01L 21/681 29/407.01 |

FOREIGN PATENT DOCUMENTS

WO    2006069341 A2    6/2006

\* cited by examiner

*Primary Examiner* — Thomas Randazzo
(74) *Attorney, Agent, or Firm* — Lowenstein Sandler LLP (57) ABSTRACT

A system includes a light emitter attached to a destination chamber, the light emitter to emit a collimated light beam across an entrance to the destination chamber. The system includes an end effector attached to a distal end of an arm of a robot. The system includes a two-dimensional (2D) area sensor disposed on the end effector at a location that coincides with the collimated light beam while the end effector reaches within the destination chamber. The 2D area sensor is to detect a location of the collimated light beam incident on a surface of the 2D area sensor and transmit, to a controller coupled to the robot, sensing data including the location.

21 Claims, 7 Drawing Sheets

SENSOR-BASED POSITION AND ORIENTATION FEEDBACK OF ROBOT END EFFECTOR WITH RESPECT TO DESTINATION CHAMBER

TECHNICAL FIELD

Embodiments of the present disclosure relate to sensor-based position and orientation feedback of vacuum robot end effector with respect to a destination chamber.

BACKGROUND

A robot, which is positioned on a platform of a processing system, has an arm that includes an end effector used to move a substrate onto a substrate support of a destination chamber (such as a processing chamber). The processing equipment requires a high level of precision and thus the robot is to, as precisely as possible, center the substrate on the substrate support as it sets the substrate down within the destination chamber.

There is currently no way of feeding back the actual location of an end effector (e.g., blade) of a robot so that the robot can precisely guide a substrate (such as a wafer) from the end effector onto the substrate support (such as an electrostatic chuck (ESC)) or other station of a destination chamber during substrate transfer. The robot, instead, uses forward/inverse kinematic processing to estimate the position of the end effector, which may lack a target level of accuracy, particularly with aging processing equipment.

For example, positioning errors may arise from issues with robot linkages and degradation of mechanical structures with age. In endeavoring repeatability of movements into and out of the destination chamber, for example, the robot may encounter inaccuracies in estimation of link lengths and forward/inverse kinematics calculations, mechanical backlash, and link flexibility. To perform diagnostics of the robot to resolve such positioning errors causes down time in substrate processing. This is at least because the robot cannot be taught or retrained without performing lengthy diagnostics within the processing equipment environment.

SUMMARY

Some of the embodiments described herein cover a processing system including a light emitter attached to a destination chamber, the light emitter to emit a collimated light beam across an entrance to the destination chamber. The light emitter may alternatively be attached to a slit valve or port associated with the destination chamber. The system may further include an end effector attached to a distal end of an arm of a robot and a two-dimensional (2D) area sensor disposed on the end effector at a location that coincides with the collimated light beam while the end effector reaches within the destination chamber. The 2D area sensor is to detect a location of the collimated light beam incident on a surface of the 2D area sensor and transmit, to a controller of the robot, sensing data including the location.

In some embodiments, a method includes attaching a light emitter to a destination chamber, where the light emitter emits a collimated light beam. The method may further include orienting the light emitter so that the collimated light beam crosses an entrance to the destination chamber. The method may further include detecting, by a 2D area sensor disposed on an end effector of an arm of a robot, a location of the collimated light beam incident on a surface of the 2D area sensor. The method may further include transmitting, by a wireless communicator disposed on the end effector and coupled to the 2D area sensor, the location within sensing data to a controller of the robot.

In additional or related embodiments, a method includes guiding, by a robot controller, an end effector located at a distal end of an arm of a robot. The guiding may include inserting the end effector, which is carrying a substrate, inside of a destination chamber. The method may further include receiving, by the robot controller, sensing data from a 2D area sensor disposed on the end effector, the sensing data including a location of a collimated light beam incident on a surface of the 2D area sensor. The collimated light beam can originate from a light emitter attached to the destination chamber. The method may further include positioning, by the robot controller, the end effector within the destination chamber relative to the location of the collimated light beam incident on the 2D area sensor to accurately place the substrate onto a substrate support of the destination chamber.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to systems and methods for positioning an end effector of an arm of a robot within a destination chamber using direct sensor-based measurements. The robot, which may be a vacuum or atmospheric robot, may be part of a larger substrate processing system used to process substrates (e.g., wafers). The destination chamber may be any of a processing chamber, a front end opening pod (FOUP), load lock, load port, aligner, or other processing station. In particular, embodiments enable the use of a light emitter that emits one or more collimated light beams at an entrance to the destination chamber together with a two-dimensional (2D) area sensor disposed on the end effector at a location that coincides with the collimated light beam in order to detect the locations of the collimated light beams relative to the end effector. The light emitter may be a laser, a light emitting diode (LED), or similar light source that emits a collimated beam of light, e.g., within approximately 1-3 millimeters in diameter.

More specifically, a processing system may include a light emitter attached to a destination chamber, the light emitter to emit a collimated light beam across an entrance to the destination chamber. The system may further include an end effector attached to a distal end of an arm of a robot. The system may further include the 2D area sensor disposed on the end effector at a location that coincides with the collimated light beam while the end effector reaches within the destination chamber. The 2D area sensor may detect a location of the collimated light beam incident on the surface of the 2D area sensor and transmit, to a controller of the robot, sensing data including the location. The controller may then determine, based on the location, what movements to impart to the end effector to accurately place a substrate into a destination chamber, e.g., onto a substrate support of the destination chamber.

For example, as the robot guides the end effector into the destination chamber, the robot may use the sensing data received from the 2D area sensor to accurately place the substrate onto a substrate support such as an electrostatic (ESC) chuck of a processing chamber. By pairing the collimated light beam(s) with the 2D area sensor on the end effector, direct sensor measurements of the position of the end effector with respect to the destination chamber may enable more precise location determination of the end effector than is possible with use of forward/inverse kinematics processing. More specifically, a robot controller may use a higher accuracy placement method by driving the robot linkages using a virtual potential fields method, which employs an approximately constant Jacobian matrix, which tracks control errors independent of kinematics calculations. Further, use of the direct-feedback measurements from sensors as described herein avoids insertion of a special calibration disc into the destination chamber or manually performing other diagnostics to calibrate robot kinematics. Accordingly, embodiments avoid wasteful downtime of processing system equipment associated with calibrating robot arms. Additionally, because the light emitter and 2D area sensor are not inserted into the destination chamber, their exposure to corrosive processing gases, high temperatures, and other harsh process conditions are minimized.

Embodiments are discussed with reference to the light emitter attached to a destination chamber and a 2D area sensor disposed on an end effector of a robot arm for a robot (whether vacuum or atmospheric robot). However, it should be understood that the light emitter may alternatively be attached to a slit valve or port associated with the destination chamber rather than being directly attached to the destination chamber. The end effector of the robot arm may pass through the slit valve or port to place the substrate into the destination chamber, e.g., onto a substrate support within the destination chamber. The substrate support may be an ESC in a processing chamber or other substrate support located in a FOUP, load lock, load port, aligner, or other processing station. For example, one or more light emitter may be disposed on a processing chamber, a FOUP, load lock, load port, aligner, and the like. Further, a 2D area sensor disposed on an end effector may detect a location of a collimated light beam emitted by the collimated light emitter. This information may be used by a controller to accurately place a substrate in the destination chamber, including to place the substrate centered onto a substrate support.

Figure 1:
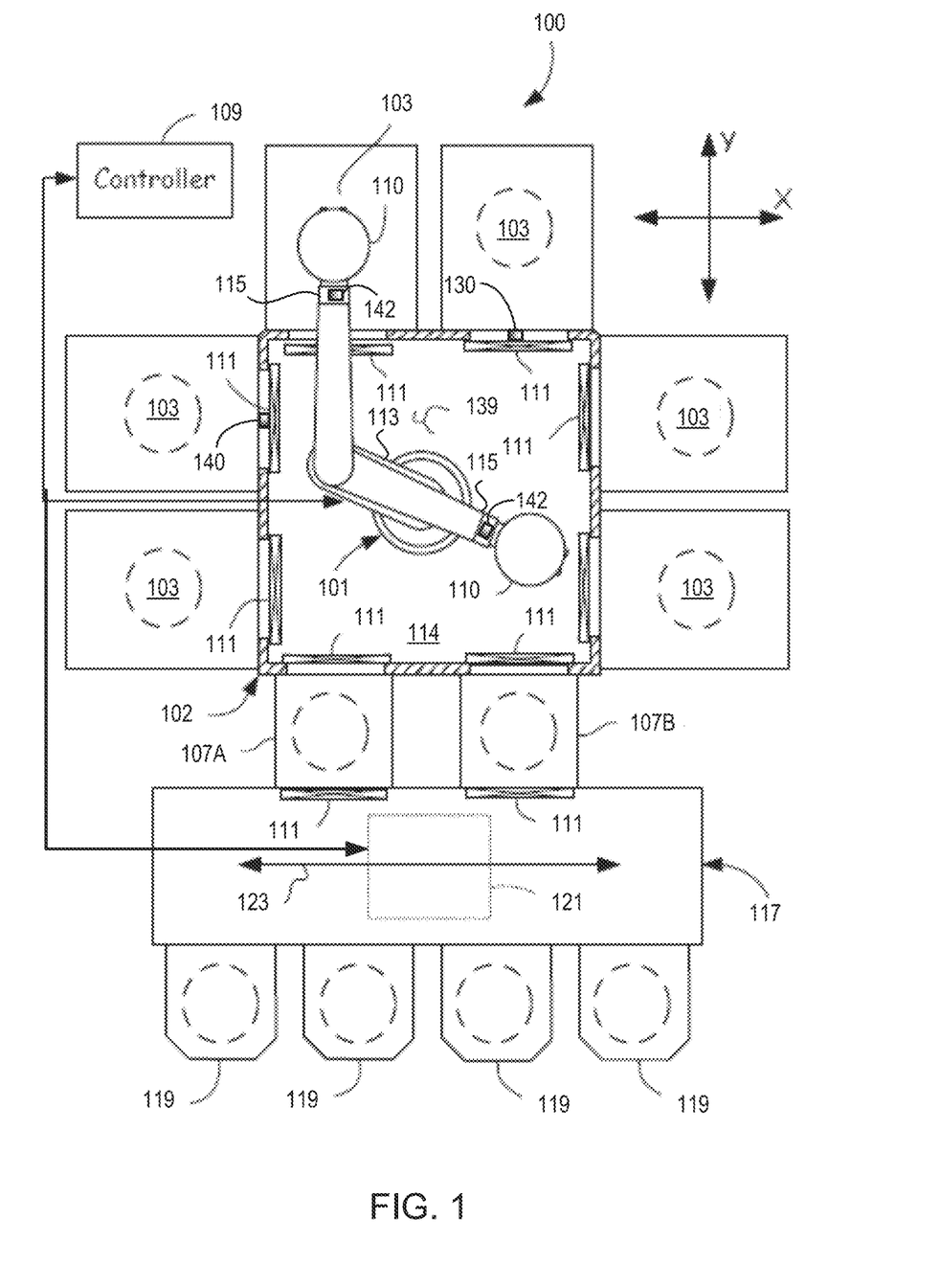
FIG. 1 is a top schematic view of an example processing system, according to one aspect of the disclosure.

FIG. 1 is a top schematic view of an example processing system 100, according to one aspect of the disclosure. The processing system 100 includes a transfer chamber robot 101 and a factory interface robot 121 each adapted to pick and place substrates 110 (sometimes referred to as "wafers" or "semiconductor wafers") from or to a destination in an electronic device processing system such as the processing system 100 illustrated in FIG. 1. However, any type of electronic device substrate, mask, or other silica-containing substrate (generally referred to as "substrates" herein) may be conveyed and transferred by the disclosed robots. For example, the destination for the substrates 110 may be one or more processing chambers 103 and/or one or more of the load lock apparatus 107A, 107B that may be distributed about and coupled to a transfer chamber 114. As shown, substrate transfers may be through slit valves 111, for example.

The processing system 100 may further include a mainframe 102 including the transfer chamber 114 and at least two processing chambers 103. A housing of the mainframe 102 includes the transfer chamber 114 therein. The transfer chamber 114 may include top wall (not shown), bottom wall (floor) 139, and side walls, and, in some embodiments, may be maintained in a vacuum, for example. In the depicted embodiment, the transfer chamber robot 101 is mounted to the bottom wall (floor) 139. However, the transfer chamber robot 101 could be mounted elsewhere, such as to the top wall.

In various embodiments, the processing chambers 103 may be adapted to carry out any number of processes on the substrates 110. The processes may include deposition, oxidation, nitration, etching, polishing, cleaning, lithography, metrology, or the like. Other processes may be carried out as well. The load lock apparatus 107A, 107B may be adapted to interface with a factory interface 117 or other system component, that may receive substrates 110 from substrate carriers 119 (e.g., Front Opening Unified Pods (FOUPs)) that may be docked at load ports of the factory interface 117, for example. The factory interface robot 121 (shown dotted) may be used to transfer the substrates 110 between the substrate carriers 119 and each load lock apparatus 107A, 107B. Transfers of the substrates 110 may be carried out in any sequence or direction. The factory interface robot 121 may be identical (or similar) to the transfer chamber robot 101 in some embodiments, but may further include a mechanism to allow the factory interface robot to move laterally in either lateral direction and indicated by arrow 123. Any other suitable robot may be used as the factory interface robot 121.

In embodiments, and by way of exemplified explanation for any robot, the transfer chamber robot 101 includes at least one arm 113 (e.g., a robot arm) and at least one end effector 115 coupled to the arm 113. The end effector 115 is controllable by the transfer chamber robot 101 in order to pick up a substrate 110 from a load lock apparatus 107A or 107B, guide the substrate 110 through one of the slit valves 111 of a processing chamber 103, and accurately place the substrate 110 onto substrate support (208 in FIG. 2) of the processing chamber 103.

A controller 109 controls various aspects of the processing system 100. The controller 109 may receive signals from and send controls to the factory interface robot 121, the transfer chamber robot 101, and one or more sensors that will be discussed. The controller 109 may thus control the transfer chamber robot 101 to pick and place substrates 110 as discussed herein. The controller 109 may, in order to control the transfer chamber robot 101, perform forward/inverse kinematics calculations in order to track a position of the end effector 115 in order to guide the end effector 115 in transferring the substrates 110 into and out of the processing chambers 103, the load locks 107A and 107B, and the substrate carriers. The controller 109 may further receive and process sensing data from various sensors, in order to obtain more precise location information for the end effector 115 according to some embodiments as will be explained in detail.

The controller 109 may be and/or include a computing device such as a personal computer, a server computer, a programmable logic controller (PLC), a microcontroller, and so on. The controller 109 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 may include a data storage device (e.g., one or more disk drives and/or solid state drives), a main memory, a static memory, a network interface, and/or other components. The controller 109 may execute instructions to perform any one or more of the methodologies and/or embodiments described herein. The instructions may be stored on a computer readable storage medium, which may include the main memory, static memory, secondary storage and/or processing device (during execution of the instructions).

In embodiments, a light emitter 130 (or multiple light emitters) may be attached to one or more of the processing chambers 103 (e.g., at an exterior of the processing chambers 103). The light emitter 130 may be a laser, a light emitting diode (LED), or similar light source that emits a collimated beam of light, e.g., within 1-3 millimeters in approximately diameter. Alternatively, the light emitter 130 may be attached to the slit vales 111 associated with the processing chambers 103. Light emitter 130 may also be attached to load locks 107A-B, slit valves 111 of load locks 107A or 107B, and/or other components such as FOUPS, load ports, and the like. End effectors 115 of the arms 113 may include 2D area sensors 142 or other detectors, positioned at a location that coincides with laser beam(s) (from one of the laser emitters) when the end effectors are inserted into a destination chamber.

In various embodiments, a controller 109 of the robot 101 or 121 may control the end effectors 115 into a destination chamber (such as a processing chamber 103 or FOUP 119, for example) based on sensing data, which specifies the position of the end effectors 115, received from the 2D area sensors 142 upon detecting the collimated light beam(s). In particular, the controller 109 may use the sensing data to precisely set a substrate onto a substrate support at the destination chamber. The presently disclosed features are discussed in more detail with reference to FIG. 2.

Figure 2:
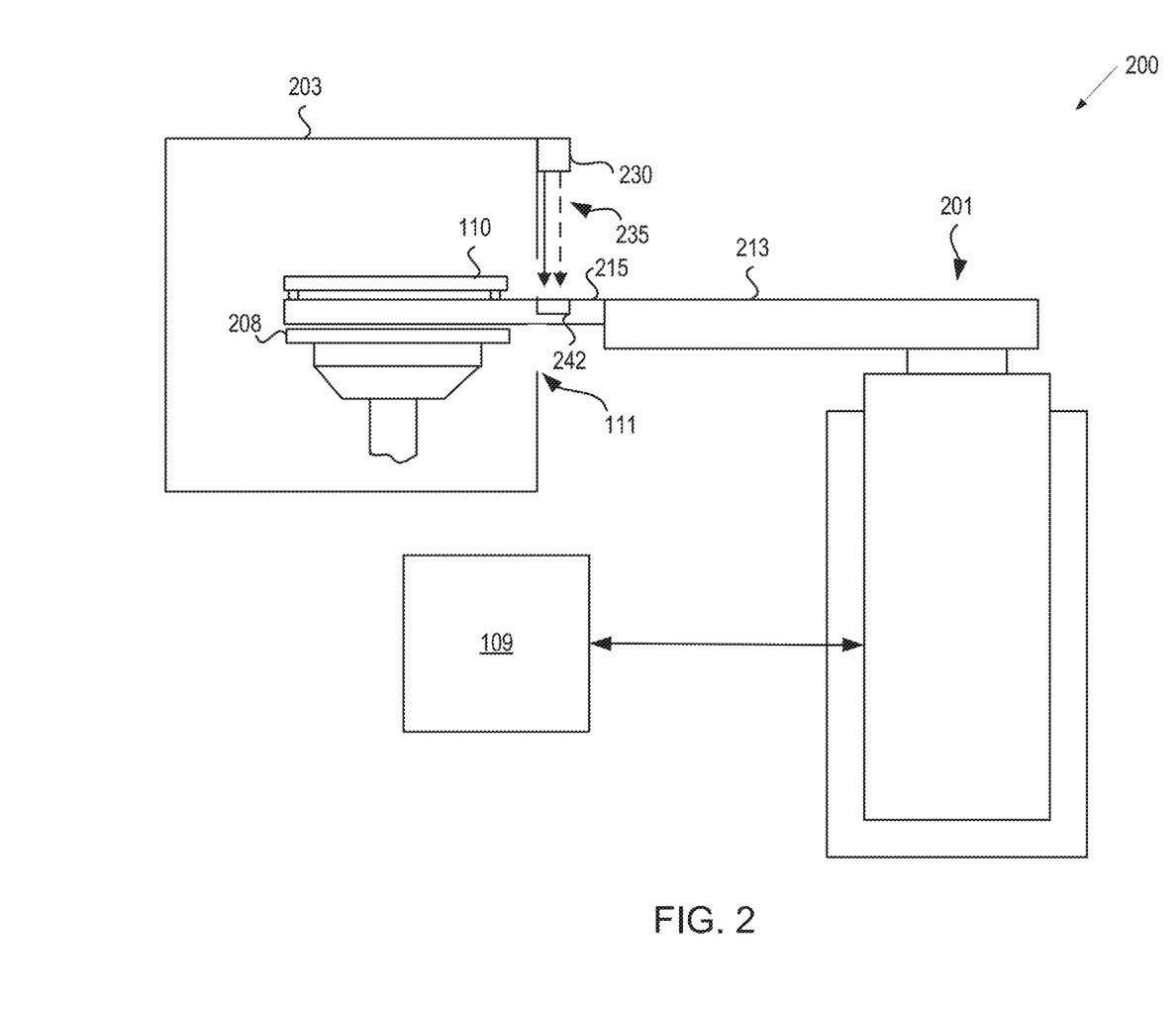
FIG. 2 illustrates a simplified side view of a portion of the processing system, according to one aspect of the disclosure.

FIG. 2 illustrates a simplified side view of a portion 200 of the processing system 100, according to one aspect of the disclosure. In particular, portion 200 of the processing system 100 includes a robot 201, which may be the factory interface robot 121 or the transfer chamber robot 101, for example. The robot 201 in turn includes an arm 213 coupled to an end effector 215 that is carrying a substrate 110. The end effector 215 has inserted the substrate 110 (e.g., through a slit valve) into a destination chamber 203 and is positioning the end effector 215 in order to place the substrate 110 onto a substrate support 208 (e.g., an electrostatic chuck (ESC)) of the destination chamber 203. The substrate 110 resides on the substrate support 208 during processing of the substrate 110. The destination chamber 203 may be any of the processing chamber 103, the substrate carrier 119 (e.g., FOUP), the load lock 107A or 107B, load port, aligner, or other processing station.

In embodiments, one or more light emitter 230 is attached to the destination chamber 203, e.g., to an outside wall of the destination chamber 203 or to a slit valve or port associated with the destination chamber 203. The light emitter 230 may be the same or similar to the light emitter 130 of FIG. 1. The light emitter 230 may emit one or more collimated light beam(s) 235, where illustrated for purposes of explanation, is a first collimated light beam and an optional second collimated light beam. The light emitter 230 may be oriented so that the collimated light beam(s) 235 cross in front of an entrance of the destination chamber, e.g., of the slit valve 111.

Further, at least one 2D area sensor 242 or other detector may be disposed on the end effector 215 at a location that coincides with the collimated light beam(s) 235 while the end effector 215 reaches within the destination chamber 203. For example, the 2D area sensor 242 may be located on a distal end of the end effector 215 sufficiently near the arm 213, e.g., so as not to enter the destination chamber 203 while the end effector 215 places a substrate onto the substrate support 208. In one embodiment, the 2D area sensor 242 is embedded within a top surface of the end effector 215. The 2D area sensor 242 is to detect a location of the collimated light beam(s) 235 incident on a surface of the 2D area sensor 242 and transmit sensing data, which includes the location in some form, to the controller 109 of the robot 201. In one embodiment, the controller 109 is integrated within the robot 201, although the controller 109 is depicted as a separate component in the illustrated embodiments.

In other embodiments, the light emitter 230 is positioned on top the destination chamber 203 (or other location outside of the destination chamber 203) such that the collimated light beam(s) 235 pass through a glass window of the destination chamber 203. In this way, the collimated light beam(s) 235 can bounce off the 2D area sensor 242 while the 2D area sensor 242 is inside of the destination chamber 203.

The controller 109 can then position the end effector 215 within the destination chamber 203 relative to the location of the collimated light beam incident on the 2D area sensor 242 to accurately place the substrate 110 onto a center of the substrate support 208. For example, the collimated light beam location on the surface of the 2D area sensor 242 may correspond to a relative known location of a center of the substrate support 208. If the light emitter 230 emits at least two collimated light beams 235, which are incident on the 2D area sensor 242, then the controller 109 may also use the sensing data, which includes locations of the at least two collimated light beams, to determine an orientation of the end effector 215 with respect to the destination chamber 203 (e.g., to the substrate support 208) using the known relative locations of the first collimated light beam and the second collimated light beam. The orientation of the end effector 215 may provide for additional precision in positioning and placing the substrate 110 onto the substrate support 208. In various embodiments, the controller 109 can further perform robot linkage diagnostics like detecting onset of backlash or belt slip based on the feedback of the location and orientation of the end effector 215.

Figure 3A:
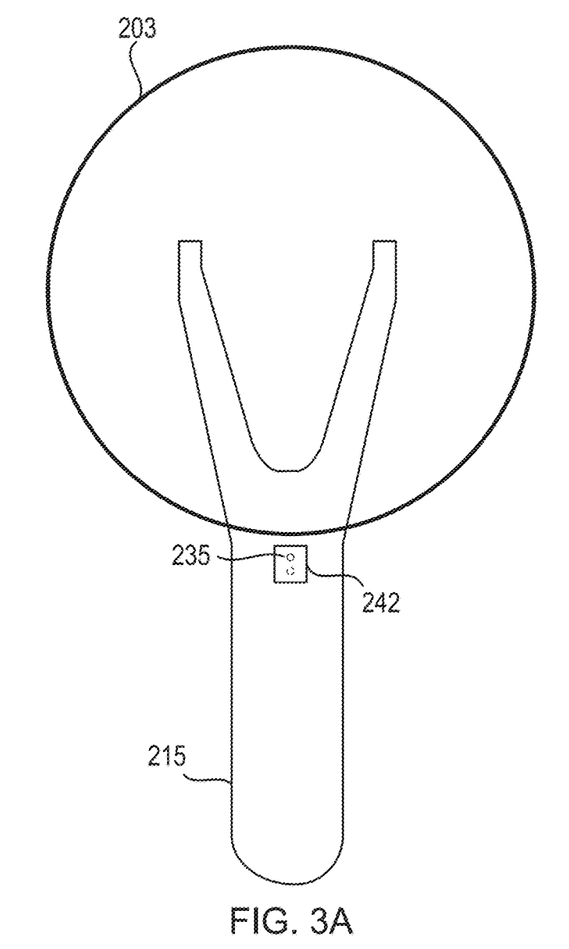
FIG. 3A is a top view of an end effector of a robot reaching into a destination chamber, according to one aspect of the disclosure.

FIG. 3A is a top view of the end effector 215 of the robot 201 reaching into the destination chamber 203, according to one aspect of the disclosure. The 2D area sensor 242, however, does not enter the destination chamber 203 in order to detect the collimated light beam(s) 235 incident on the surface of the 2D area sensor 242. Recall that the light emitter 230 may be attached to an outside of the destination chamber 203. The collimated light beam may have a known location (e.g., x, y coordinates) relative to a center of the substrate support of the destination chamber 203. Accordingly, the location of the collimated light beams detected on the 2D area sensor 242 can be used to calculate a position of the end effector 215 and of the substrate 110 on the end effector 215 relative to the center of the substrate support 208. For example, in an embodiment, the substrate 110 may be centered over the substrate support 208 when the collimated light beam 235 is centered on the 2D area sensor 242. If the collimated light beam 235 is detected off center on the 2D area sensor 242, then the end effector 215 may be repositioned (e.g., in the x and/or y directions) until the collimated light beam 235 is centered on the 2D area sensor 242, ensuring that the substrate 110 will be centered on the substrate support 208 of the destination chamber 203.

Figure 3B:
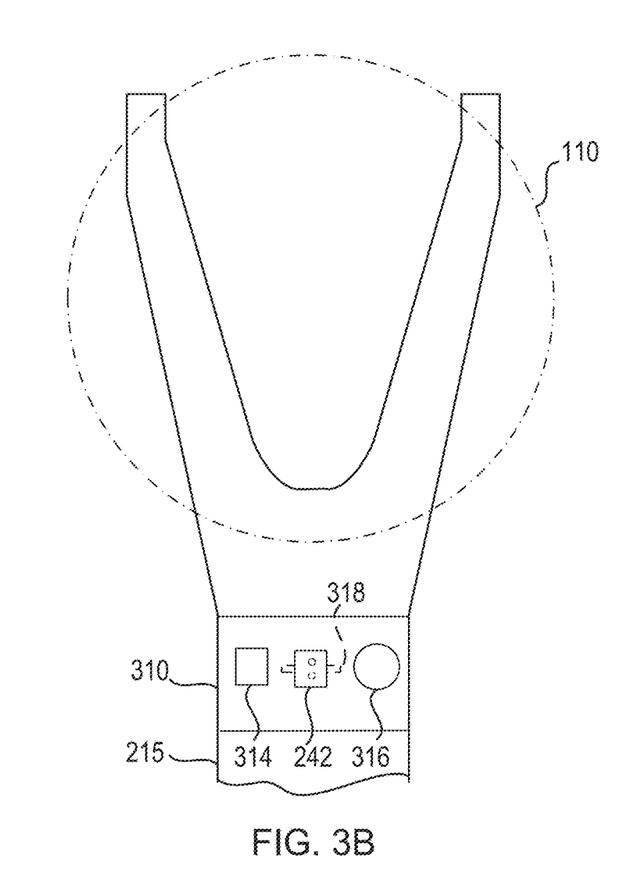
FIG. 3B is a top, enlarged view illustrating details of the end effector of FIG. 3A, according to aspects of the disclosure.

In embodiments in which two collimated light beams are used and with additional reference to the substrate of FIG. 3B, a yaw or angle of the end effector 215 relative to the substrate support 208 may also be determined. The displacement, which may be detected by one or two 2D area sensors, between the two collimated light beams may be known, and may be used to determine a yaw or angular error of the end effector 215. For example, the two collimated light beams may be aligned on the x-axis in a reference frame of the processing chamber. The end effector 215 may have a separate reference frame in which the x-axis is aligned with the longitudinal axis of the end effector 215 (or to an axis normal to the longitudinal axis of the end effector). The x-axis of the end effector 215 may correspond to the x-axis of the destination chamber 203 when there is zero yaw or angle to the substrate. If the two collimated light beams are detected at different y-axis locations on the 2D area sensor, then it may be determined that the x-axis of the arm is not aligned with the x-axis of the destination chamber, and that there is some angle between the two x-axes. The controller may then adjust the orientation of the arm to remove the angular error caused by the non-zero yaw.

FIG. 3B is a top, enlarged view illustrating details of the end effector 215 of FIG. 3A, according to aspects of the disclosure. In some embodiments, the end effector 215 includes a hermetically sealed portion 310 that includes the electronics of the end effector 215, e.g., that is non-outgassing and thus protected from the corrosive gases and high temperatures and the like present in the processing system 100.

In various embodiments, the electronics may include, but not be limited to, the 2D area sensor 242, a wireless communicator 314, and a power source 316 to power the 2D area sensor 242. In embodiments, the 2D area sensor 242 is a complementary metal-oxide semiconductor (CMOS) active pixel type image sensor. In other embodiments, the 2D area sensor 242 is a charge coupled device or a position sensitive detector. The 2D area sensor 242 may have a diagonal length of up to 4.60 millimeters (or more) and a pixel density of at least 3,000 pixels in a first dimension and at least 2,500 pixels in a second dimension. The 2D area sensor 242 may also include at least 8 megapixels in number. This high-density of pixels within the 2D area sensor 242 enables accurate determination of location of the incident collimated light beam(s) 235, e.g., to a nanometer level of accuracy. In one example, the 2D area sensor 242 is diagonal 4.6 mm (type 1/4.0) 8M pixel CMOS image sensor with square pixels for color cameras (e.g., IMX219 made by Sony®).

In various embodiments, the wireless communicator 314 may be based on one (or more) of a number of different wireless communication technologies, including, but not limited to, light pulses (e.g., optical signals), infrared, broadband links (or related technologies), and/or 2.4 GHz or 5.0 GHz WiFi®, Bluetooth®, ZigBee®, Zwave® and the like. The wireless communicator 314 may be coupled to the 2D area sensor 242 and be adapted to transmit the sensing data from the 2D area sensor 242 to the controller 109 and/or the robot 201. The power source 316 may be a lithium-ion battery, an inductive wireless charger coil and charging circuit, a solar cell such as a solar charging capacitor, or other power source. In other embodiments, the communicator 314 is not wireless, and is instead wired using a signal feedthrough using a direct conductor or non-contact method such as via optical communication.

In one embodiment, the end effector 215 further includes a linear actuator 318 disposed on the end effector 215 and operatively coupled to the 2D area sensor 242. The linear actuator 318 can move the 2D area sensor 242 (e.g., along a linear track) in a direction parallel to the entrance of the destination chamber 203 and/or perpendicular to a longitudinal axis of the end effector 215 to ensure the 2D area sensor 242 is able to detect the collimated light beam(s) 235. The linear actuator 318 may be activated if sensing the collimated light beam(s) 235 is expected but no sensing data is generated, indicative of the collimated light beam(s) potentially falling just outside of the surface area of the 2D area sensor 242. The location of the 2D area sensor 242 may be tracked, and the updated location of the 2D area sensor 242 on the end effector 215 may be used along with a location of the collimated light beam 235 detected by the 2D area sensor 242 to determine proper positioning of the substrate 110 relative to a substrate support of the destination chamber 203.

Figure 4A:
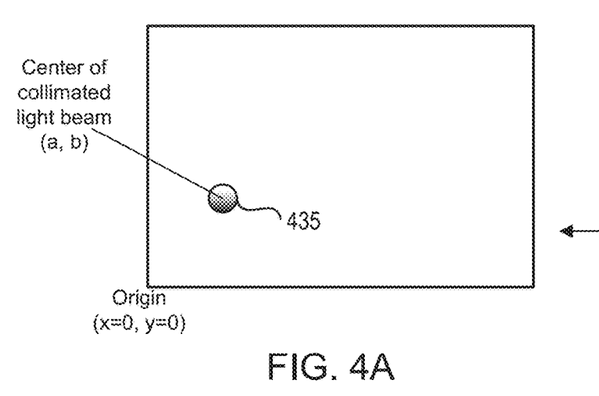
FIGS. 4A-4B are a top view of a two-dimensional (2D) area sensor, according to aspects of the disclosure.
Figure 4B:
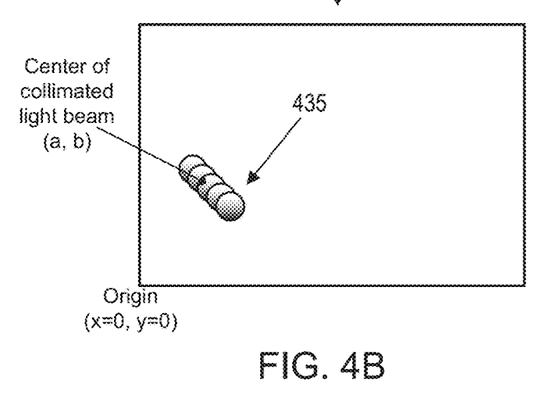
Figure 4C:
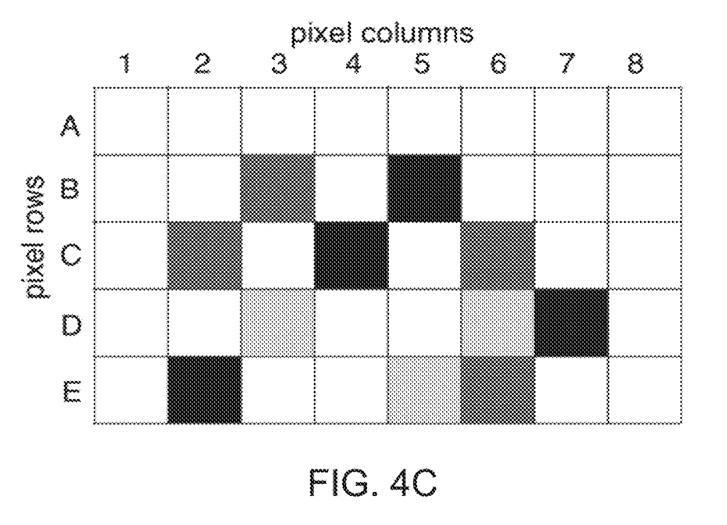
FIG. 4C is a pixel-based grid associated with the 2D area sensor of FIGS. 4A-4B, according to one aspect of the disclosure.

FIGS. 4A-4B are a top view of a two-dimensional (2D) area sensor 442, according to aspects of the disclosure. The 2D area sensor 442 may be the same as the 2D area sensor 242 of FIG. 2. The location of a collimated light beam 435 may be located as the center of the collimated light beam 435 ($a, b$) with reference to an X-Y coordinate axis system of the 2D area sensor 442. As illustrated in FIG. 4C, this X-Y coordinate axis system may be correlated to rows and columns of pixels spanning across the surface area (e.g., as a pixel-based grid) of the 2D area sensor 442.

In embodiments, the 2D area sensor 442 is to perform collimated light beam profiling to identify a shape of a cross-section of the collimated light beam 435 and to estimate a center of the shape of the collimated light beam 435 (FIG. 4A). For example, with a pixel pitch of one micron with a 12-bit depth, the theoretical resolution of the position of the end effector with reference to the destination chamber 203 is within a nanometer (nm) level of accuracy, e.g., 1/(2^12) is 0.2 nm.

In various embodiments, the 2D area sensor 442 is a high frame-rate sensor, e.g., adapted to detect at least 1,000 frames per second of the collimated light beam 435. With this high frame rate, the 2D area sensor 442 can perform algorithmic processing, employing the Nyquist theorem, to estimate a center of the collimated light beam despite vibrations associated with the collimated light beam (illustrated in FIG. 4B). These vibrations may be in the 500 Hz range or lower, for example.

The controller 109 may be calibrated such that a particular known pixel location or set of pixel locations on the 2D area sensor corresponds to a target location, e.g., a center of an ESC in a processing chamber. Accordingly, when the center of the detected collimated light beam is at the known pixel location(s) on the 2D sensor area, then it can be determined to a high level of accuracy that a center of the substrate is aligned with a center of the ESC. If the center of the detected collimated light beam is detected at a pixel location other than the particular known pixel location, then a first location error on the x-axis and/or a second location error on the y-axis may be determined. The end effector may then be repositioned to remove the location errors and cause the center of the collimated light beam to fall on the particular known pixel location(s). The controller 109 may further reteach or recalibrate the robot 201 without interrupting any vacuum by finely reorienting the collimated light beam(s) 235 or by changing (e.g., adding offset to) the stored value of a pixel position (e.g., corresponding to the center of the ESC) available to the controller 109.

Figure 5:
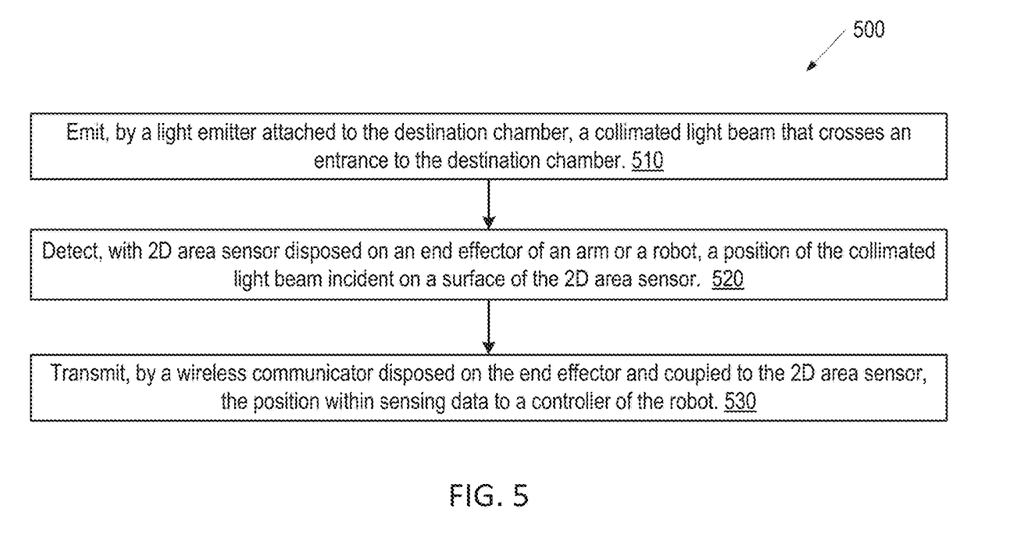
FIG. 5 is a flow chart of a method for configuring the processing system to detect a position of the end effector with respect to the destination chamber, according to various aspects of the disclosure.
Figure 6:
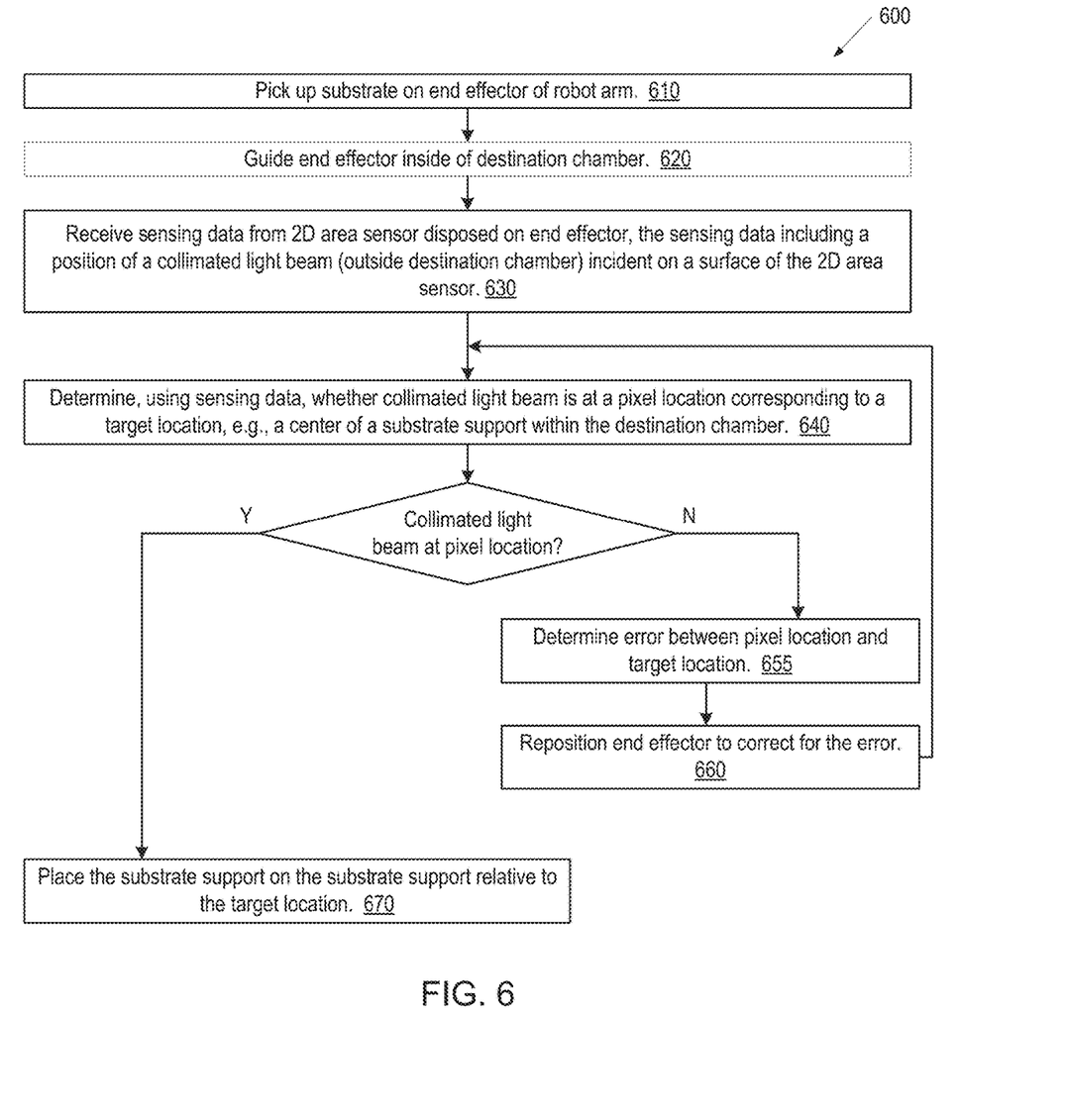
FIG. 6 is a flow chart of a method for positioning a substrate carried by the end effector onto a substrate support using the position of the end effector, according to one aspect of the disclosure.

With reference to FIGS. 5-6, methods 500 and 600 are performed by processing logic that may include hardware (circuitry, dedicated logic, etc.), software (such as is run on a general purpose computer system or a dedicated machine), firmware, or some combination thereof. Some methods 500-600 may be performed by a computing device, such as the controller 109 of FIGS. 1-2 that is in control of the robot arm 213 and/or the collimated light emitter 230. For example, processing logic that performs one or more operations of methods 500-600 may execute on controller 109, or on a combination of the controller 109, the 2D area sensor 242, and the wireless communicator 314.

FIG. 5 is a flow chart of a method 500 for configuring the processing system 100 to detect a position of the end effector 215 with respect to the destination chamber 203, according to various aspects of the disclosure. The method 500 may begin with emitting, by the light emitter 230 attached to a destination chamber 203, a collimated light beam 235 that crosses an entrance to the destination chamber 203 (510). For example, the light emitter 230 may be attached to the outside of the destination chamber 203. The processing logic may optionally orient the light emitter 230 so that the collimated light beam 235 crosses an entrance to the destination chamber 203, as illustrated in FIG. 2. The orientation of the collimated light beam 235 may be automated and correlated to a center of the substrate support 208 of the destination chamber 203 so that, when detected by the 2D area sensor 242, the location of the end effector 215 is known with respect to the center of the substrate support 208. In other implementations, the orientation of the collimated light beam 235 is set manually before being put into operation.

With continued reference to FIG. 5, the method 500 may continue with processing logic of the 2D area sensor 242 (disposed on the end effector 215) detecting a location of the collimated light beam 235 incident on a surface of the 2D area sensor 242 (520). The location of the collimated light beam 235 may be determined as was explained with reference to FIG. 2 and FIGS. 4A-4C. For example, the detecting may include translating one or a group of pixels of the 2D area sensor 242 that detect the collimated light beam to a coordinate system location of the surface of the 2D area sensor 242. The method 500 may continue with processing logic of the wireless communicator 314 (disposed on the end effector and coupled to the 2D area sensor 242) transmitting the location within sensing data to the controller 109 of the robot (530). The controller 109 may then use the sensing data as discussed with reference to FIG. 6.

FIG. 6 is a flow chart of a method 600 for positioning a substrate 110 carried by the end effector 215 onto the substrate support 208 using the position of the end effector 215, according to one aspect of the disclosure. The method 600 may begin with the processing logic causing the end effector 215 of the arm 213 of the robot 201 to pick up the substrate 110 (610). The method 600 may continue with the processing logic guiding the end effector 215 (located at a distal end of the arm 213 of the robot 201) inside of the destination chamber 203 (620). For example, the processing logic may insert the end effector 215 inside of the destination chamber 203 with use of forward/inverse kinematics or similar processing that estimates the position of the end effector 215 with respect to the destination chamber 203.

With continued reference to FIG. 6, the method 600 may continue with the processing logic receiving sensing data from the 2D area sensor 242 disposed on the end effector, the sensing data including a location of a collimated light beam 235 incident on a surface of the 2D area sensor 242 (630). Recall that the collimated light beam originates from the light emitter 230 attached to the destination chamber 203 (or other structure associated with the destination chamber). The method 600 may continue with the processing logic positioning the end effector 215 within the destination chamber 203 relative to the location of the collimated light beam 235 incident on the 2D area sensor 242 to accurately place the substrate 110 on the substrate support 208 (e.g., ESC). This positioning and placement of the substrate 110 may be performed as follows.

The method 600 may continue with the processing logic determining, using the sensing data, whether the collimated light beam is at a pixel location (or a first pixel location) of the 2D area sensor 242 corresponding to a target location, e.g., a center of the substrate support 208 within the destination chamber (640). If yes, the method 600 may continue with the processing logic, in response to the location of the collimated light beam being at the pixel location, placing the substrate 110 on the substrate support 208 relative to the target location, e.g., centered on the substrate support (670).

If no, the pixel location of the collimated light beam does not correspond to the target location, the method 600 may continue with the processing logic determining an error between the pixel location and the target location (655). The method 600 may continue with the processing logic repositioning the end effector 215 to correct for the error (660). The method 600 may continue with the processing logic looping back to again determine whether the collimated light beam is at a pixel location corresponding to a target location, e.g., a center of the substrate support 208 within the destination chamber (640). The method 600 may iterate through repositioning of the end effector until the location of the collimated light beam is substantially equal to the pixel location, which corresponds to the center of the substrate support, and then complete placement of the substrate (670). The placement of the substrate 110 onto the substrate support 208 may be within a nanometer level of accuracy to a center of the substrate support 208, for example, based on a precision level of the location detected by the 2D area sensor 242, as discussed with reference to FIGS. 4A-4C.

Figure 7:
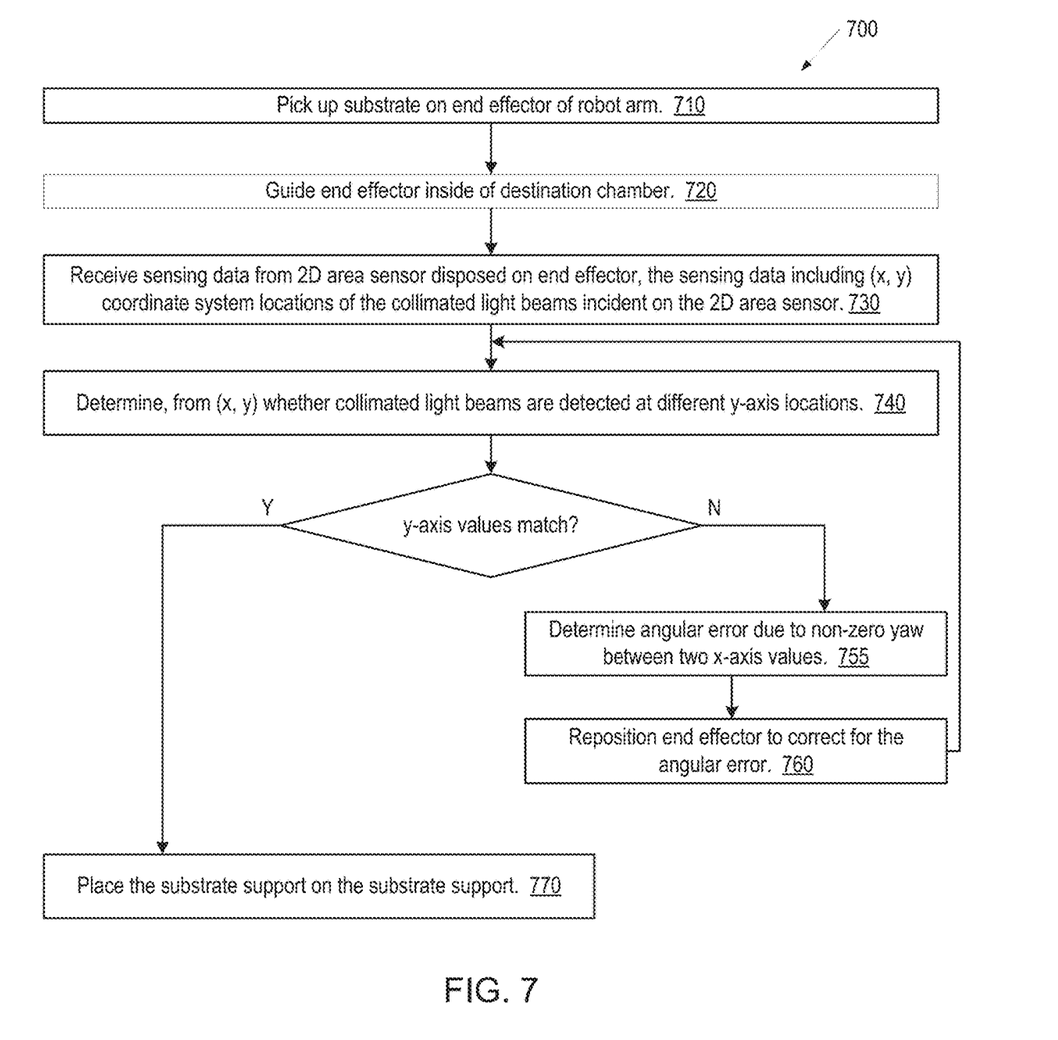
FIG. 7 is a flow chart of a method for positioning a substrate carried by the end effector onto the substrate support via correction for angular error, according to various aspects of the disclosure.

FIG. 7 is a flow chart of a method 700 for positioning a substrate 110 carried by the end effector 215 onto the substrate support 208 via correction for angular error, according to various aspects of the disclosure. The method 700 may begin with the processing logic causing the end effector 215 of the arm 213 of the robot 201 to pick up the substrate 110 (710). The method 700 may continue with the processing logic guiding the end effector 215 (located at a distal end of the arm 213 of the robot 201) inside of the destination chamber 203 (720). For example, the processing logic may insert the end effector 215 inside of the destination chamber 203 with use of forward/inverse kinematics or similar processing that estimates the position of the end effector 215 with respect to the destination chamber 203.

With continued reference to FIG. 7, the method 700 may continue with the processing logic receiving sensing data from the 2D area sensor 242 disposed on the end effector, the sensing data including data from the 2D area sensor 242 disposed on the end effector 215 (730). The sensing data may include data including (x, y) coordinate system locations of at least two collimated light beams incident on the 2D area sensor. The method 700 may continue with the processing logic determining whether the (x, y) locations of the two collimated light beams include different y-axis locations, e.g., an indication of non-zero yaw between the end effector 215 and the destination chamber (740). If the y-axis values match, then there is no angular error and the method 700 can continue with the processing logic placing the substrate on the substrate support (e.g., the ESC) of the destination chamber (770).

If the y-axis values do not match, then there is non-zero yaw and the method 700 can continue with the processing logic determining an angular error due to the non-zero yaw between the two x-axis values of the (x, y) locations of the two collimated light beams (755). The method 700 may continue with the processing logic repositioning the end effector 215 to correct for the angular error previously calculated (760). The method 700 may continue with the processing logic looping back to determine once again whether the (x, y) locations of the two collimated light beams include different y-axis locations (740). The method 700 may iterate through determining whether there is non-zero yaw that indicates potential angular error until the angular error is substantially eliminated, e.g., to a threshold level of accuracy. The method 700 may then, as mentioned, continue with the processing logic placing the substrate on the substrate support of the destination chamber (770).

While the embodiment of FIG. 7 is specific to two collimated light beams that are nominally at the same x location, and thus a change in y axis indicates yaw or angular error, an alternative embodiment includes tracking a general difference between the first collimated light beam position (x1, y1) and the second collimated light beam position (x2, y2). If such a difference exists between these positions, the method of FIG. 7 can be extended to more generally calculate a change in x, a change in y, and a change in yaw. These changes can be in turn used to calculate angular error regardless of relative position difference between the two collimated light beams.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
   a light emitter attached to a destination chamber, the light emitter to emit a collimated light beam across an entrance to the destination chamber;
   an end effector attached to a distal end of an arm of a robot; and
   a two-dimensional (2D) area sensor disposed on the end effector at a location that coincides with the collimated light beam while the end effector reaches within the destination chamber, the 2D area sensor to:
   detect a location of the collimated light beam that is incident on a surface of the 2D area sensor; and
   transmit, to a controller of the robot, sensing data comprising the location.

2. The system of claim 1, wherein the 2D area sensor is one of a complementary metal-oxide semiconductor (CMOS) active pixel type image sensor, a charge coupled device, or a position sensitive detector.

3. The system of claim 2, wherein the 2D area sensor has a diagonal length of up to 4.60 millimeters or more and is comprised of a pixel density of at least 3,000 pixels in a first dimension and at least 2,500 pixels in a second dimension.

4. The system of claim 1, wherein the 2D area sensor is embedded in a top surface of a distal end of the end effector.

5. The system of claim 1, further comprising the controller, wherein the controller is to use the sensing data to determine a location of the end effector with respect to the destination chamber.

6. The system of claim 5, wherein the location is determined within a nanometer level of accuracy.

7. The system of claim 5, wherein the controller is further to perform positioning of the end effector, using the location of the end effector, to cause the end effector to accurately place a substrate onto a substrate support within the destination chamber.

8. The system of claim 1, wherein the light emitter is to emit two collimated light beams and the sensing data comprises locations of the two collimated light beams that are incident on the surface of the 2D area sensor, further comprising the controller, wherein the controller is to use the sensing data to determine an orientation of the end effector with respect to the destination chamber.

9. The system of claim 8, wherein the controller is further to perform positioning of the end effector, using the orientation of the end effector, to cause the end effector to accurately place a substrate onto a substrate support within the destination chamber.

10. The system of claim 1, further comprising:
a wireless communicator coupled to the 2D area sensor, the wireless communicator to transmit the sensing data to the controller; and
a power source to provide power to the 2D area sensor and the wireless communicator;
wherein the 2D area sensor, the wireless communicator, and the power source are hermetically sealed within the end effector.

11. The system of claim 1, wherein the 2D area sensor is to perform collimated light beam profiling to identify a shape of a cross-section of the collimated light beam and to estimate a center of the shape of the collimated light beam.

12. The system of claim 1, wherein the 2D area sensor is adapted to:
detect at least 1,000 frames per second of the collimated light beam; and
perform algorithmic processing, employing the Nyquist theorem, to estimate a center of the collimated light beam despite vibrations associated with the collimated light beam.

13. The system of claim 1, further comprising a linear actuator disposed on the end effector and operatively coupled to the 2D area sensor, wherein the linear actuator is to move the 2D area sensor in a direction parallel to the entrance of the destination chamber to ensure the 2D area sensor is able to detect the collimated light beam.

14. A method comprising:
emitting, by a light emitter attached to a destination chamber, a collimated light beam that crosses an entrance to the destination chamber;
detecting, by a two-dimensional (2D) area sensor disposed on an end effector of an arm of a robot, a location of the collimated light beam that is incident on a surface of the 2D area sensor; and
transmitting, by the 2D area sensor, the location within sensing data to a controller of the robot.

15. The method of claim 14, wherein the detecting comprises translating one or a group of pixels of the 2D area sensor that detect the collimated light beam to a coordinate system location of the surface of the 2D area sensor.

16. The method of claim 14, further comprising calculating, by the 2D area sensor, collimated light beam profiling comprising:
identifying a shape of a cross-section of the collimated light beam; and
estimating a center of the shape of the collimated light beam.

17. The method of claim 14, further comprising, by the 2D area sensor:
detecting at least 1,000 frames per second of the collimated light beam; and
performing algorithmic processing, employing the Nyquist theorem, to estimate a center of the collimated light beam despite vibrations associated with the collimated light beam.

18. A method comprising:
guiding, by a robot controller, an end effector located at a distal end of an arm of a robot, wherein guiding comprises inserting the end effector, which is carrying a substrate, inside of a destination chamber;
receiving, by the robot controller, sensing data from a two-dimensional (2D) area sensor disposed on the end effector, the sensing data comprising a location of a collimated light beam that is incident on a surface of the 2D area sensor, wherein the collimated light beam originates from a light emitter attached to the destination chamber; and
positioning, by the robot controller, the end effector within the destination chamber relative to the location of the collimated light beam that is incident on the 2D area sensor to accurately place the substrate onto a substrate support of the destination chamber.

19. The method of claim 18, wherein the positioning comprises calculating, by the robot controller using the sensing data, a location of the end effector with respect to a center of the substrate support within a nanometer level of accuracy.

20. The method of claim 18, wherein the positioning comprises:
determining, using the sensing data, whether the location of the collimated light beam that is incident on the 2D area sensor is at a first pixel location corresponding to a center of the substrate support;
in response to the location of the collimated light beam not being at the first pixel location:
determining an error between the location of the collimated light beam and the first pixel location on the 2D area sensor;
repositioning the end effector to correct for the error; and
placing the substrate onto the substrate support in response to the location of the collimated light beam being substantially equal to the first pixel location of the 2D area sensor.

21. The method of claim 18, wherein the light emitter emits two collimated light beams and the sensing data comprises locations of the two collimated light beams that are incident on the surface of the 2D area sensor, and wherein the positioning comprises calculating, by the robot controller using the sensing data, an orientation of the end effector with respect to a center of the substrate support.

* * * * *